(12) United States Patent
Bak et al.

(10) Patent No.: US 10,396,275 B2
(45) Date of Patent: Aug. 27, 2019

(54) MAGNETIC MEMORY DEVICE

(71) Applicants: Junghoon Bak, Suwon-si (KR); Hong Hyun Kim, Seoul (KR)

(72) Inventors: Junghoon Bak, Suwon-si (KR); Hong Hyun Kim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/668,693

(22) Filed: Aug. 3, 2017

(65) Prior Publication Data

US 2018/0198062 A1 Jul. 12, 2018

(30) Foreign Application Priority Data

Jan. 11, 2017 (KR) .................. 10-2017-0004328

(51) Int. Cl.
| | |
|---|---|
| *H01L 43/02* | (2006.01) |
| *G11C 11/16* | (2006.01) |
| *H01L 27/22* | (2006.01) |
| *H01L 43/08* | (2006.01) |
| *H01L 43/10* | (2006.01) |
| *H01L 43/12* | (2006.01) |

(52) U.S. Cl.
CPC ............ *H01L 43/08* (2013.01); *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC ....... H01L 43/08; H01L 43/02; H01L 27/222; H01L 27/226; G11C 11/161; G11C 11/02; G11C 11/22; G11C 14/0036
See application file for complete search history.

(56) References Cited

U.S. PATENT DOCUMENTS

| | | |
|---|---|---|
| 7,863,060 B2 | 1/2011 | Belen et al. |
| 8,278,122 B2 | 10/2012 | Lu et al. |
| 8,975,088 B2 | 3/2015 | Satoh et al. |
| 9,029,170 B2 | 5/2015 | Li |
| 9,041,131 B2 | 5/2015 | Li et al. |
| 9,257,638 B2 | 2/2016 | Tan et al. |
| 2006/0033145 A1* | 2/2006 | Kakoschke ........ G11C 16/0416 257/315 |
| 2007/0264423 A1* | 11/2007 | Miura .................. B82Y 10/00 427/127 |
| 2010/0240151 A1 | 9/2010 | Belen et al. |
| 2010/0315870 A1* | 12/2010 | Abedifard ............ G11C 11/16 365/171 |
| 2011/0189796 A1 | 8/2011 | Lu et al. |

(Continued)

FOREIGN PATENT DOCUMENTS

| | | |
|---|---|---|
| JP | 5779871 B2 | 9/2015 |
| KR | 101222190 B1 | 1/2013 |

*Primary Examiner* — Galina G Yushina
(74) *Attorney, Agent, or Firm* — Renaissance IP Law Group LLP (57) ABSTRACT

A magnetic tunnel junction pattern includes a first magnetic layer, a tunnel barrier layer, a second magnetic layer, and a non-magnetic capping layer that are sequentially stacked on a substrate. A top electrode is disposed on the magnetic tunnel junction pattern. A bit line is disposed on the top electrode. The top electrode comprises a metal nitride pattern in contact with the non-magnetic capping layer and a metal pattern disposed on the metal nitride pattern.

8 Claims, 9 Drawing Sheets

(56) References Cited

U.S. PATENT DOCUMENTS

| | | |
|---|---|---|
| 2013/0119497 A1 | 5/2013 | Li |
| 2013/0250670 A1* | 9/2013 | Nakai .................. G11C 11/161 365/158 |
| 2013/0337582 A1 | 12/2013 | Satoh et al. |
| 2014/0217532 A1 | 8/2014 | Li et al. |
| 2014/0233305 A1* | 8/2014 | Kim .................... G11C 11/1673 365/158 |
| 2015/0001654 A1* | 1/2015 | Sandhu .................. H01L 43/02 257/421 |
| 2015/0104883 A1* | 4/2015 | Kim ...................... C23C 14/046 438/3 |
| 2015/0236251 A1* | 8/2015 | Noh ........................ H01L 43/12 438/3 |
| 2015/0280113 A1 | 10/2015 | Tan et al. |
| 2016/0020386 A1 | 1/2016 | Kim et al. |
| 2016/0099287 A1* | 4/2016 | Nagamine ............. H01L 27/228 257/295 |
| 2016/0141490 A1 | 5/2016 | Jung et al. |
| 2016/0225979 A1* | 8/2016 | Hsu ........................ H01L 43/08 |
| 2016/0343937 A1* | 11/2016 | Jo |

* cited by examiner

MAGNETIC MEMORY DEVICE

CROSS-REFERENCE TO RELATED APPLICATION

This application claims priority under 35 U.S.C § 119 to Korean Patent Application No. 10-2017-0004328 filed on Jan. 11, 2017 in the Korean Intellectual Property Office, the disclosure of which is incorporated by reference in its entirety.

TECHNICAL FIELD

The present inventive concept relates to a magnetic memory device.

DISCUSSION OF RELATED ART

As electronic devices demand high speed and lower power consumption, the electronic devices access their memory devices at high-speed read/write operations with low operating voltages. The magnetic memory devices operate at high speed with nonvolatile characteristics.

SUMMARY

According to an exemplary embodiment of the present inventive concept, a magnetic memory device is provided as follows. A magnetic tunnel junction pattern includes a first magnetic layer, a tunnel barrier layer, a second magnetic layer, and a non-magnetic capping layer that are sequentially stacked on a substrate. A top electrode is disposed on the magnetic tunnel junction pattern. A bit line is disposed on the top electrode. The top electrode comprises a metal nitride pattern in contact with the non-magnetic capping layer and a metal pattern disposed on the metal nitride pattern.

According to an exemplary embodiment of the present inventive concept, a magnetic memory device is provided as follows. A first magnetic tunnel junction pattern and a second magnetic tunnel junction pattern are horizontally spaced apart from each other on a substrate. A first bit line is disposed on the first magnetic tunnel junction pattern. A first select element is disposed in the substrate. The first bit line is electrically connected to the first select element through the first magnetic tunnel junction pattern. A second bit line is disposed on the second magnetic tunnel junction pattern. A second select element is disposed in the substrate. The second bit line is electrically connected to the second select element through the second magnetic tunnel junction pattern. A first top electrode and a second top electrode are disposed on the first magnetic tunnel junction pattern and the second magnetic tunnel junction pattern, respectively. Each of the first top electrode and the second top electrode comprises a metal nitride pattern and a metal pattern disposed on the metal nitride pattern. The metal nitride pattern is thinner than the metal pattern.

According to an exemplary embodiment of the present inventive concept, a magnetic memory device is provided as follows. A bottom electrode is disposed on a substrate. A magnetic layer is disposed on the bottom electrode. A non-magnetic capping layer is disposed on the magnetic layer. A metal nitride pattern is in contact with the non-magnetic capping layer. A metal pattern is disposed on the metal nitride pattern. A bit line is disposed on the metal pattern. The metal nitride pattern is disposed between the non-magnetic capping layer and the metal pattern.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Exemplary embodiments of the present inventive concept will be described below in detail with reference to the accompanying drawings. However, the present inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

Figure 1:
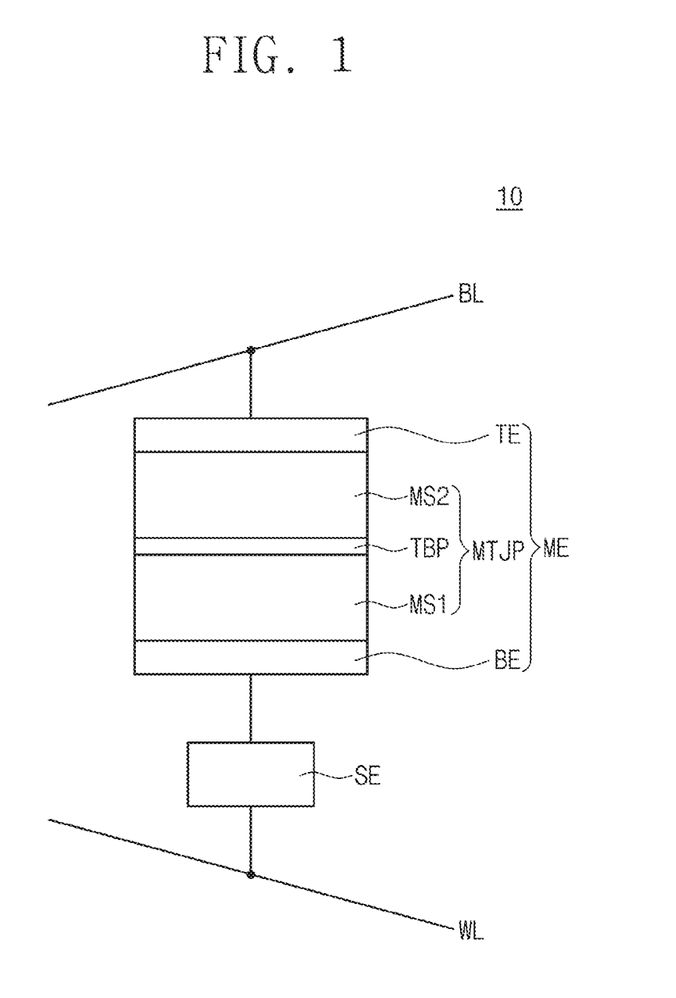
FIG. 1 is a circuit diagram illustrating a unit memory cell of a magnetic memory device including a magnetic tunnel junction pattern according to an exemplary embodiment of the present inventive concept.

FIG. 1 is a circuit diagram illustrating a unit memory cell of a magnetic memory device including a magnetic tunnel junction pattern according to an exemplary embodiment of the present inventive concept.

Referring to FIG. 1, a unit memory cell 10 may include a memory element ME and a select element SE that are disposed between a bit line BL and a word line WL crossing each other. The memory element ME may include a bottom electrode BE, a magnetic tunnel junction pattern MTJP, and a top electrode TE. The memory element ME may be electrically connected in series to the select element SE.

The select element SE may be configured to selectively control a charge flow passing across the magnetic tunnel junction pattern MTJP. For example, the select element SE may be one of a diode, a PNP bipolar transistor, an NPN bipolar transistor, an NMOSFET (N-type metal-oxide-semiconductor field effect transistor), and a PMOSFET (P-type metal-oxide-semiconductor field effect transistor). If the select element SE is configured as a three-terminal device such as a bipolar transistor or a MOS field effect transistor, an additional interconnection line (not shown) may be connected to the select element SE. The magnetic tunnel junction pattern MTJP may include a first magnetic pattern MS1, a second magnetic pattern MS2, and a tunnel barrier pattern TBP therebetween. Each of the first and second magnetic patterns MS1 and MS2 may include at least one magnetic layer.

One of the first and second magnetic patterns MS1 and MS2 may have a magnetization direction that is fixed regardless of an external magnetic field under a normal use environment. In this description, a pinned layer is intended to refer to a magnetic layer having the fixed magnetic characteristics. The other of the first and second magnetic patterns MS1 and MS2 may have a magnetization direction that is switched by an external magnetic field applied thereto. In this description, a free layer is intended to refer to a magnetic layer having the reversible magnetic characteristics. The magnetic tunnel junction pattern MTJP may have an electrical resistance depending on a relative orientation of magnetization directions of the free and pinned layers. For example, the electrical resistance of the magnetic tunnel junction pattern MTJP may be much greater when the magnetization directions of the free and pinned layers are antiparallel than when the magnetization directions of the free and pinned layers are parallel. Consequently, the electrical resistance of the magnetic tunnel junction pattern MTJP may be controlled by changing the magnetization direction of the free layer, and this difference in resistance may be used as a data storage mechanism for magnetic memory devices according to an exemplary embodiment of the present inventive concept. The tunnel barrier pattern TBP and the first and second magnetic patterns MS1 and MS2 will be described with reference to FIGS. 10 and 11.

Figure 2:
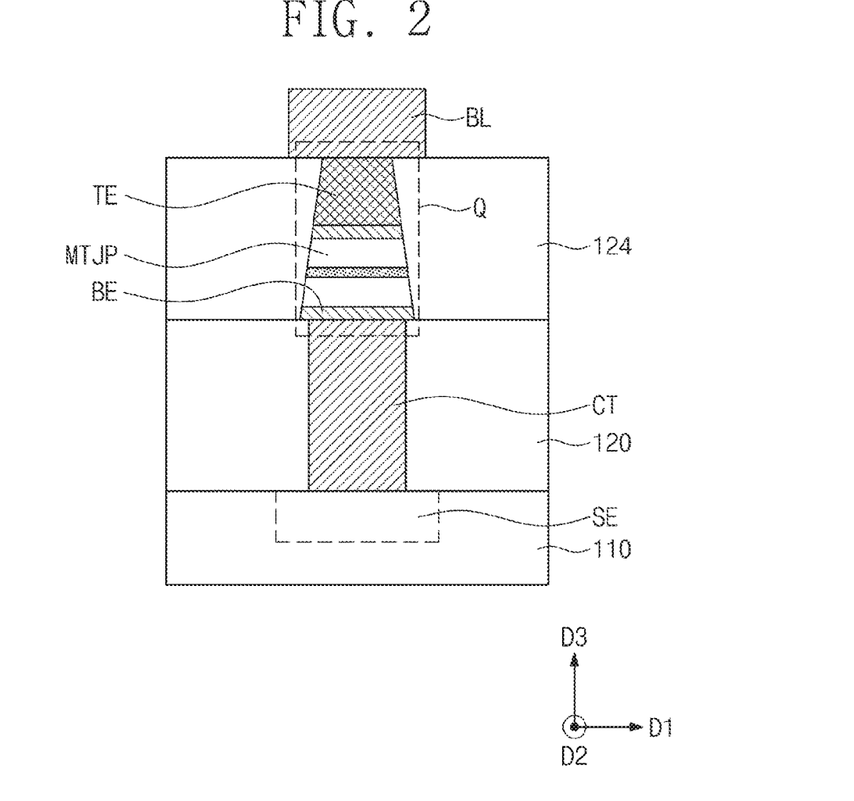
FIG. 2 is a cross-sectional view illustrating a unit memory cell of a magnetic memory device including a magnetic tunnel junction pattern according to an exemplary embodiment of the present inventive concept.
Figure 3:
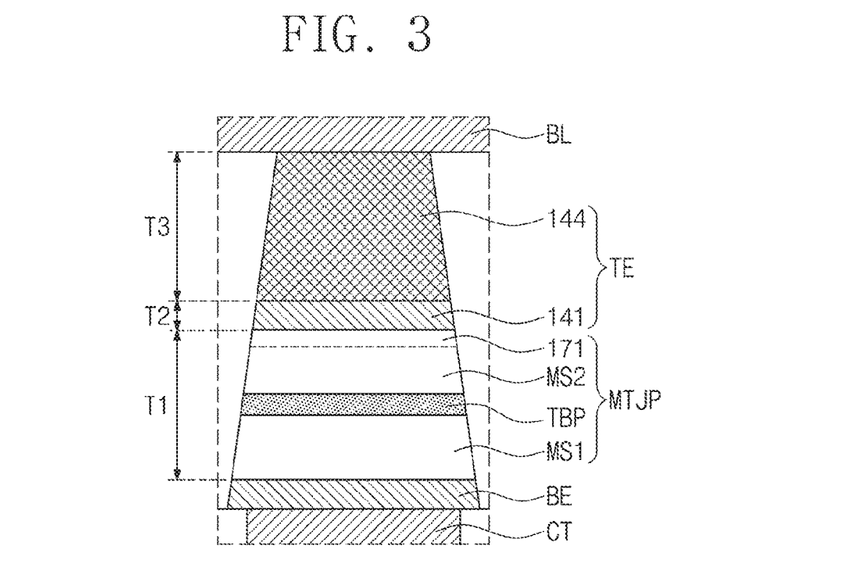
FIG. 3 is an enlarged view of section Q of FIG. 2 according to an exemplary embodiment of the present inventive concept.

FIG. 2 is a cross-sectional view illustrating a unit memory cell of a magnetic memory device including a magnetic tunnel junction pattern according to an exemplary embodiment of the present inventive concept. FIG. 3 is an enlarged view of section Q of FIG. 2 according to an exemplary embodiment of the present inventive concept.

Referring to FIGS. 2 and 3, a substrate 110 may be provided. For example, the substrate 110 may be a silicon substrate, an SOI (silicon-on-insulator) substrate, a germanium substrate or a GOI (germanium-on-insulator). The substrate 110 may include a select element SE. For example, the select element SE may be a selection device including a word line.

A contact plug CT may be provided such that the contact plug CT is electrically connected to the select element SE. For example, a terminal of the select element SE may be coupled to the contact plug CT penetrating a first interlayer dielectric layer 120 on the substrate 110. The contact plug CT may include a doped semiconductor (e.g., doped silicon), metal (e.g., tungsten, titanium, or tantalum), conductive metal nitride (e.g., titanium nitride, tantalum nitride, or tungsten nitride), or metal-semiconductor compound (e.g., metal silicide). A bottom electrode BE, a magnetic tunnel junction pattern MTJP, and a top electrode TE may be sequentially stacked on the contact plug CT. The bottom electrode BE may include a conductive material such as metal, conductive metal nitride, and doped semiconductor. The magnetic tunnel junction pattern MTJP may include a first magnetic pattern MS1, a second magnetic pattern MS2, and a tunnel barrier pattern TBP therebetween. The bottom electrode BE, the magnetic tunnel junction pattern MTJP, and the top electrode TE may be provided in a second interlayer dielectric layer 124. The first and second interlayer dielectric layers 120 and 124 may include, for example, silicon oxide, silicon nitride, or silicon oxynitride.

The magnetic tunnel junction pattern MTJP may include a non-magnetic capping layer 171 at its upper portion. For example, the non-magnetic capping layer 171 may be disposed between the second magnetic pattern MS2 and the top electrode TE. The non-magnetic capping layer 171 may be a topmost layer of the magnetic tunnel junction pattern MTJP. The non-magnetic capping layer 171 may be a non-magnetic metal layer. For example, the non-magnetic capping layer 171 may include Ru, Ta, Ti, Mg, Hf, Zr, W, or Mo. The present inventive concept is not limited thereto. For example, the non-magnetic capping layer 171 may include a non-magnetic metallic element, an oxygen element, and a nonmetallic element combined with oxygen. The nonmetallic element may be different from the oxygen element. The non-magnetic metallic element may include, for example, Ru, Ta, Ti, Mg, Hf, Zr, W, or Mo. The nonmetallic element may be, for example, boron (B). In an exemplary embodiment, the non-magnetic capping layer 171 may include an amorphous portion.

The top electrode TE may include a metal nitride pattern 141 and a metal pattern 144 on the metal nitride pattern 141. A bit line BL may be provided on the top electrode TE. For example, the bit line BL may be in contact with the metal pattern 144. The metal pattern 144 may be a layer including an element such as tungsten, titanium, and tantalum. The metal nitride pattern 141 may be a layer including tungsten nitride, titanium nitride, or tantalum nitride. In an exemplary embodiment, the metal nitride pattern 141 may include a metal element different from the metal pattern 144. For example, the metal pattern 144 may be a tungsten pattern, and the metal nitride pattern 141 may be a titanium nitride pattern. The present inventive concept is not limited thereto. For example, the metal nitride pattern 141 may include the same metal element as the metal pattern 144. For example, the metal pattern 144 may be a tungsten pattern, and the metal nitride pattern 141 may be a tungsten nitride pattern.

The metal pattern 144 may have a thickness T3 greater than a thickness T2 of the metal nitride pattern 141. The metal pattern 144, the metal nitride pattern 141, and the magnetic tunnel junction pattern MTJP may have a thickness relationship thereamong. In determining the thickness relationship, formation processes of the metal pattern 144, the metal nitride pattern 141 and the magnetic tunnel junction pattern MTJP may be considered. For example, if the metal pattern 144 is excessively thick, neighboring magnetic tunnel junction patterns MTJP may be prevented from being completely separated from each other in an ion beam etching process. If the ion beam etching process is performed to form the magnetic tunnel junction pattern MTJP, the metal pattern 144 that is excessively thick may shield ion beams so that bottom portions of the magnetic tunnel junction patterns MTJP are not separated from each other. In addition, when contacts (not shown) are formed at the same level as the metal pattern 144, the contacts may be incompletely formed due to their aspect ratios that become increased in proportion to a thickness of the metal pattern 144. If the metal pattern 144 is excessively thin, the magnetic tunnel junction pattern MTJP may suffer from damages caused by loss of the top electrode TE in forming a line or a contact structure on the top electrode TE. For example, the thickness of the metal pattern 144 may be controlled such that in an ion beam etching process, a magnetic tunnel junction pattern MTJP formed adjacent to the metal pattern 144 is formed without loss of the top electrode TE. The top electrode TE may include the metal pattern 144.

For example, the thickness T3 of the metal pattern 144 may be about 5 times to about 7 times the thickness T2 of the metal nitride pattern 141. In an exemplary embodiments, the thickness T3 of the metal pattern 144 may be about 250 Å to about 350 Å, and the thickness T2 of the metal nitride pattern 141 may be about 40 Å to about 60 Å. The magnetic tunnel junction pattern MTJP may have a thickness T1 of about 0.5 times to about 1.5 times the thickness T3 of the metal pattern 144. For example, the thickness T3 of the metal pattern 144 may be smaller than the thickness T1 of magnetic tunnel junction pattern MTJP. For example, the thickness T1 of the magnetic tunnel junction pattern MTJP may be about 250 Å to about 350 Å. The metal nitride pattern 141 may have a width in a first direction D1 less than a width in the first direction D1 of the magnetic tunnel junction pattern MTJP and greater than a width in the first direction D1 of the metal pattern 144.

The metal nitride pattern 141 may increase adhesion between the metal pattern 144 and the non-magnetic capping layer 171. The metal pattern 144 may serve as a mask for patterning its underlying magnetic tunnel junction layer using an ion beam etching process. The metal nitride pattern 141 may be interposed between the metal pattern 144 and its underlying magnetic tunnel junction layer, providing an increased adhesion force between the metal pattern 144 and its underlying magnetic tunnel junction layer. The metal nitride pattern 141 may be prevented from collapsing and being separated from the underlying magnetic tunnel junction layer patterned in the ion beam etching process.

Figure 4:
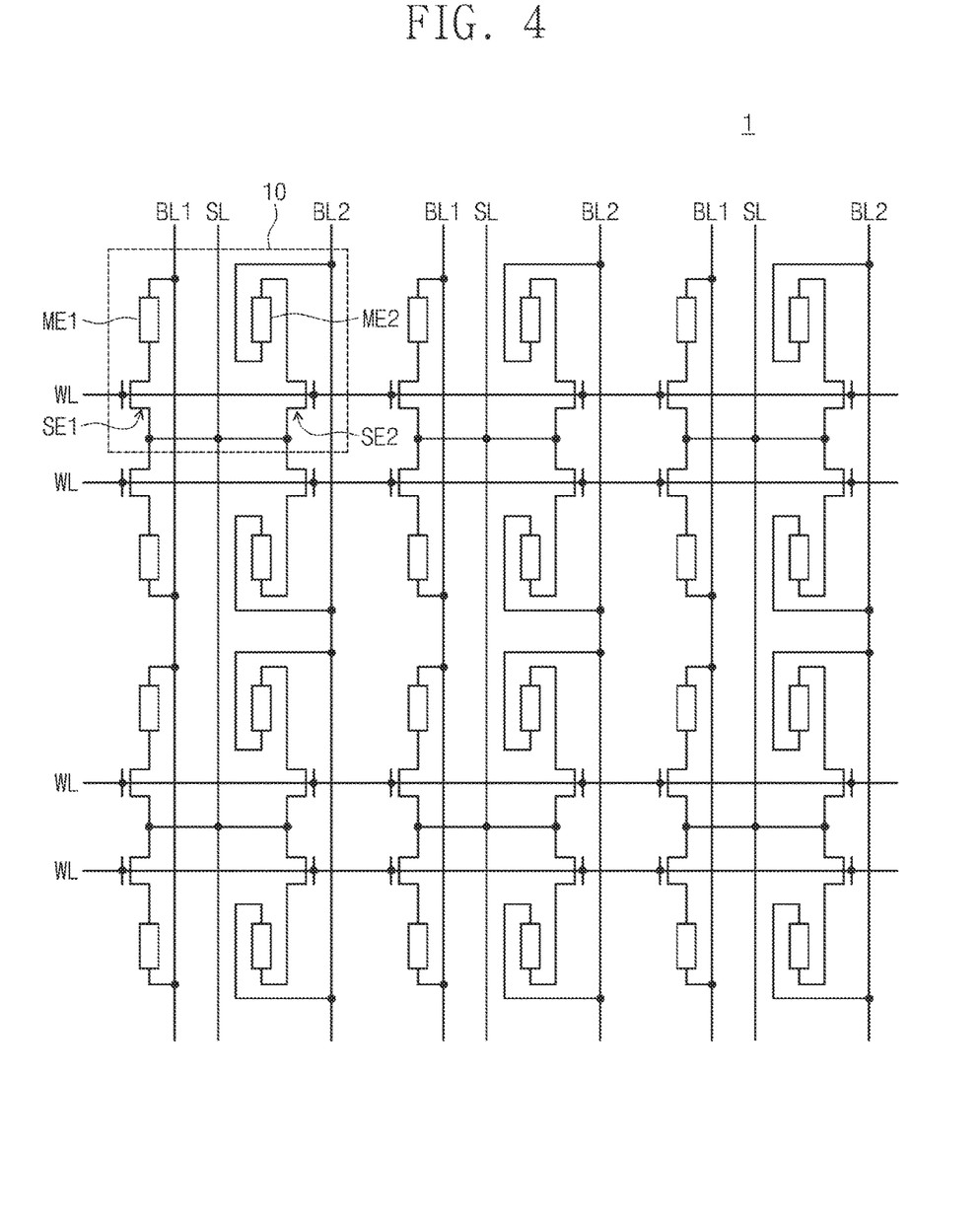
FIG. 4 is a circuit diagram illustrating a memory cell array of a memory device according to an exemplary embodiment of the present inventive concept.

FIG. 4 is a circuit diagram illustrating a memory cell array of a memory device according to an exemplary embodiment of the present inventive concept. Referring to FIG. 4, a memory cell array 1 may include a plurality of word lines WL arranged in columns and rows, a plurality of bit lines BL1 and BL2, a plurality of source lines SL, and a plurality of unit memory cells 10. The bit lines BL1 and BL2 may be arranged to run across the word lines WL. As shown in FIG. 4, the source lines SL may be parallel to the bit lines BL1 and BL2. The present inventive concept, however, is not limited thereto. For example, the source lines SL may be parallel to the word lines WL.

The unit memory cells 10 each may be connected between a word line WL and a pair of the bit lines BL1 and BL2 running across the word line WL. Each of the unit memory cells 10 may include a first memory element ME1, a second memory element ME2, a first select element SE1, and a second select element SE2.

The first memory element ME1 may be connected between the first select element SE1 and a first bit line BL1. The second memory element ME2 may be connected between the second select element SE2 and a second bit line BL2. The first select element SE1 may be connected between the first memory element ME1 and the source line SL. The second select element SE2 may be connected between the second memory element ME2 and the source line SL. The first and second select elements SE1 and SE2 may share the source line SL and be controlled by the word line WL commonly connected to the first and second select elements SE1 and SE2. In addition, the source line SL may be connected in common to a predetermined number of the unit memory cells arranged in the same column of the unit memory cells 10. The present inventive concept is not limited thereto. For example, if the source lines SL may be parallel to the word lines WL, the source line SL may be connected in common to a predetermined number of the unit memory cells arranged in the same row of the unit memory cells 10.

A unit memory cell 10 may be selected by a word line WL and a pair of the bit lines BL1 and BL2. The unit memory cell 10 may include the first and second memory elements ME1 and ME2 that may have a structure configured to have magnetoresistance characteristics. For example, each of the first and second memory elements ME1 and ME2 may include a magnetic tunnel junction pattern. The present inventive concept is not limited thereto. For example, the first and second memory elements ME1 and ME2 may include perovskite compound or transition metal oxide.

The first and second select elements SE1 and SE2 may be a diode, a PNP bipolar transistor, an NPN bipolar transistor, an NMOSFET, or a PMOSFET. In an exemplary embodiment, the first and second select elements SE1 and SE2 may control current supply to the first and second memory elements ME1 and ME2 in accordance with voltage of the word lines WL.

Figure 5:
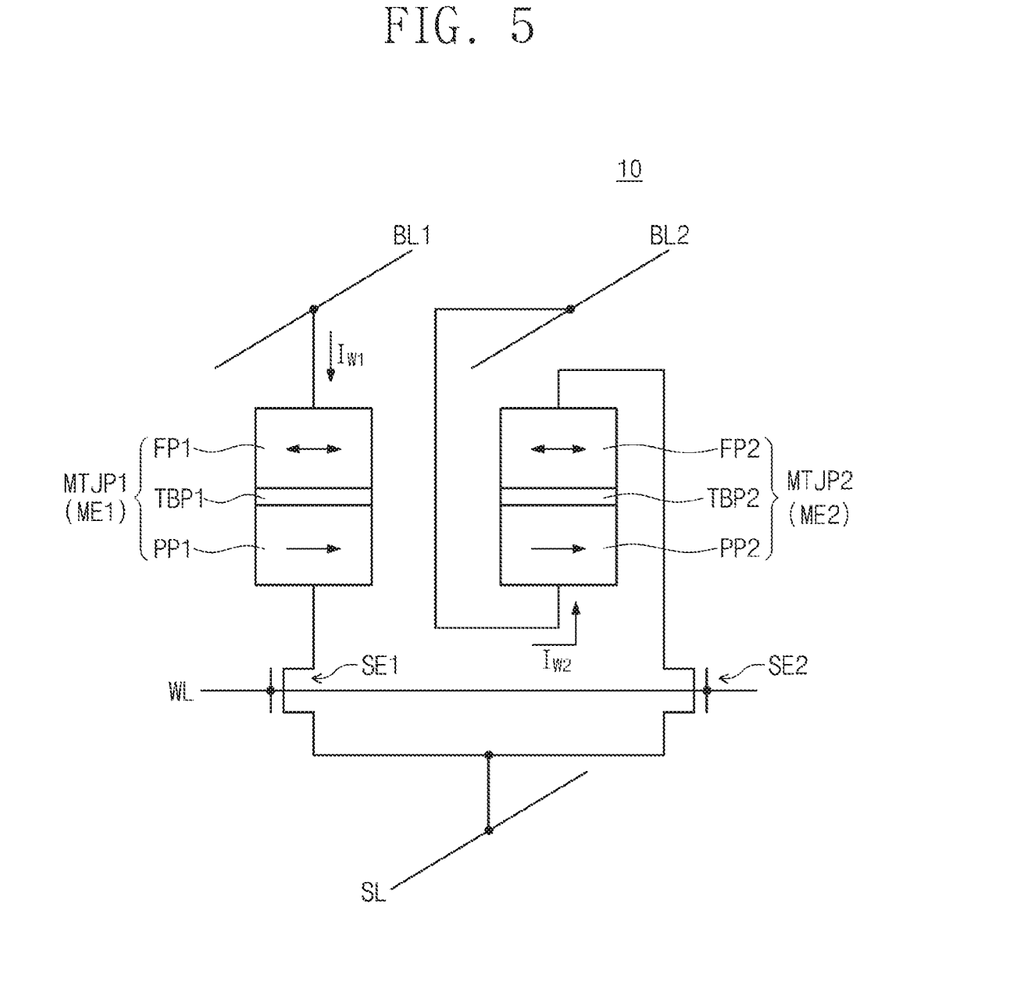
FIG. 5 is a circuit diagram illustrating a unit memory cell of a memory device according to an exemplary embodiment of the present inventive concept.

FIG. 5 is a circuit diagram illustrating a unit memory cell of a memory device according to an exemplary embodiment of the present inventive concept. For example, FIG. 5 is a circuit diagram illustrating an example of the unit memory cell discussed with reference to FIG. 4.

Referring to FIG. 5, the unit memory cell 10 may include first and second magnetic tunnel junction patterns MTJP1 and MTJP2 as the memory elements ME1 and ME2 and also include first and second select elements SE1 and SE2 as the select elements. The first magnetic tunnel junction pattern MTJP1 may include a first free pattern FP1, a first pinned pattern PP1, and a first tunnel barrier pattern TBP1 interposed therebetween. Likewise, the second magnetic tunnel junction pattern MTJP2 may include a second free pattern FP2, a second pinned pattern PP2, and a second tunnel barrier pattern TBP2 interposed therebetween. Each of the first and second pinned patterns PP1 and PP2 may have a unidirectionally fixed magnetization direction. The first free pattern FP1 may have a magnetization direction that may be changed parallel or antiparallel to the magnetization direction of the first pinned pattern PP1, and the second free pattern FP2 may have a magnetization direction that may be changed parallel or antiparallel to the magnetization direction of the second pinned pattern PP2. According to an exemplary embodiment of the present inventive concept, each of the first and second magnetic tunnel junction patterns MTJP1 and MTJP2 may be substantially the same as a magnetic tunnel junction pattern which will be described below with reference to FIGS. 10 and 11.

First and second bit lines BL1 and BL2 may be arranged to run across a word line WL, and a source line SL may be connected in common to the first and second select elements SE1 and SE2. The first magnetic tunnel junction pattern MTJP1 may be connected between the first bit line BL1 and the first select element SE1, and the first select element SE1 may be connected between the first magnetic tunnel junction pattern MTJP1 and the source line SL. The second magnetic tunnel junction pattern MTJP2 may be connected between the second bit line BL2 and the second select element SE2, and the second select element SE2 may be connected between the second magnetic tunnel junction pattern MTJP2 and the source line SL.

In an exemplary embodiment, as shown in FIG. 5, the first free pattern FP1 may be connected to the first bit line BL1, and the first pinned pattern PP1 may be connected to the first select element SE1; and the second free pattern FP2 may be connected to the second select element SE2, and the second pinned pattern PP2 may be connected to the second bit line BL2.

The present inventive concept is not limited thereto. For example, unlike FIG. 5, the first pinned pattern PP1 may be connected to the first bit line BL1, and the first free pattern FP1 may be connected to the first select element SE1; and the second pinned pattern PP2 may be connected to the second select element SE2, and the second free pattern FP2 may be connected to the second bit line BL2. For brevity of the description, it will be hereinafter assumed that the first free pattern FP1 is connected to the first bit line BL1, the first pinned pattern PP1 is connected to the first select element SE1, the second free pattern FP2 is connected to the second select element SE2, and the second pinned pattern PP2 is connected to the second bit line BL2.

In operation, the word line WL may be supplied with a turn-on voltage to write a data "1" into a unit memory cell 10 selected by the word line WL and the first and second bit lines BL1 and BL2. The first and second bit lines BL1 and BL2 may be supplied with a first bit line voltage, and the source line SL may be supplied with a first source line voltage less than the first bit line voltage.

Under the voltage condition mentioned above, the first and second select elements SE1 and SE2 may be turned on to electrically connect the first and second magnetic tunnel junction patterns MTJP1 and MTJP2 to the source line SL. In addition, the first magnetic tunnel junction pattern MTJP1 may be provided with a first write current $I_{W1}$ flowing from the first bit line BL1 to the source line SL, and the second magnetic tunnel junction pattern MTJP2 may be provided with a second write current $I_{W2}$ flowing from the second bit line BL2 to the source line SL. In this case, as viewed from the first and second magnetic tunnel junction patterns MTJP1 and MTJP2, the first write current $I_{W1}$ may flow in a direction opposite to that of the second write current $I_{W2}$. For example, if the first and second bit lines BL1 and BL2 are supplied with the same voltage, the first and second magnetic tunnel junction patterns MTJP1 and MTJP2 may be provided with write currents in opposite directions.

For example, the first write current $I_{W1}$ may be provided in a direction toward the first pinned pattern PP1 from the first free pattern FP1 of the first magnetic tunnel junction pattern MTJP1, and thus electrons may be provided in a direction toward the first free pattern FP1 from the first pinned pattern PP1. In this case, electrons having the same spin direction as that of the first pinned pattern PP1 may tunnel through the first tunnel barrier pattern TBP1 and apply torque to the first free pattern FP1. Accordingly, a magnetization direction of the first free pattern FP1 may be changed parallel to that of the first pinned pattern PP1. Unlike the first write current $I_{W1}$, the second write current $I_{W2}$ may be provided in a direction toward the second free pattern FP2 from the second pinned pattern PP2 of the second magnetic tunnel junction pattern MTJP2, and thus electrons may be provided in a direction toward the second pinned pattern PP2 from the second free pattern FP2. In this case, electrons having the opposite spin direction to that of the second pinned pattern PP2 need not tunnel through the second tunnel barrier pattern TBP2 but return to the second free pattern FP2 such that torque may be applied to the second free pattern FP2. Accordingly, a magnetization direction of the second free pattern FP2 may be changed antiparallel to that of the second pinned pattern PP2.

As discussed above, when a data "1" is written into a selected unit memory cell 10, the first magnetic tunnel junction pattern MTJP1 may have a parallel magnetization direction and the second magnetic tunnel junction pattern MTJP2 may have an antiparallel magnetization direction. For example, the first magnetic tunnel junction pattern MTJP1 may have a first resistance state and the second magnetic tunnel junction pattern MTJP2 may have a second resistance state higher than the first resistance state.

In an exemplary embodiment, the word line WL may be supplied with a turn-on voltage to write a data "0" into a unit memory cell 10 selected by the word line WL and the first and second bit lines BL1 and BL2. The first and second bit lines BL1 and BL2 may be supplied with a second bit line voltage, and the source line SL may be supplied with a second source line voltage greater than the second bit line voltage.

Under the voltage condition mentioned above, the first and second magnetic tunnel junction patterns MTJP1 and MTJP2 may be respectively supplied with currents whose directions are opposite to the first and second write currents $I_{W1}$ and $I_{W2}$. Accordingly, contrary to the case of writing the data "1", the first magnetic tunnel junction pattern MTJP1 may have an antiparallel magnetization direction and the second magnetic tunnel junction pattern MTJP2 may have a parallel magnetization direction. In this case, the first magnetic tunnel junction pattern MTJP1 may have a first resistance state and the second magnetic tunnel junction pattern MTJP2 may have a second resistance state lower than the first resistance state.

As discussed above, as the first and second magnetic tunnel junction patterns MTJP1 and MTJP2 have different resistance states from each other so that if a data stored in a unit memory cell 10 is read, one of the first and second magnetic tunnel junction patterns MTJP1 and MTJP2 may serve as a reference resistance. In this case, the unit memory cell 10 may have a sensing margin corresponding to a difference in resistance between the first and second magnetic tunnel junction patterns MTJP1 and MTJP2, and thus reliability of the unit memory cell 10 may increase.

Figure 6:
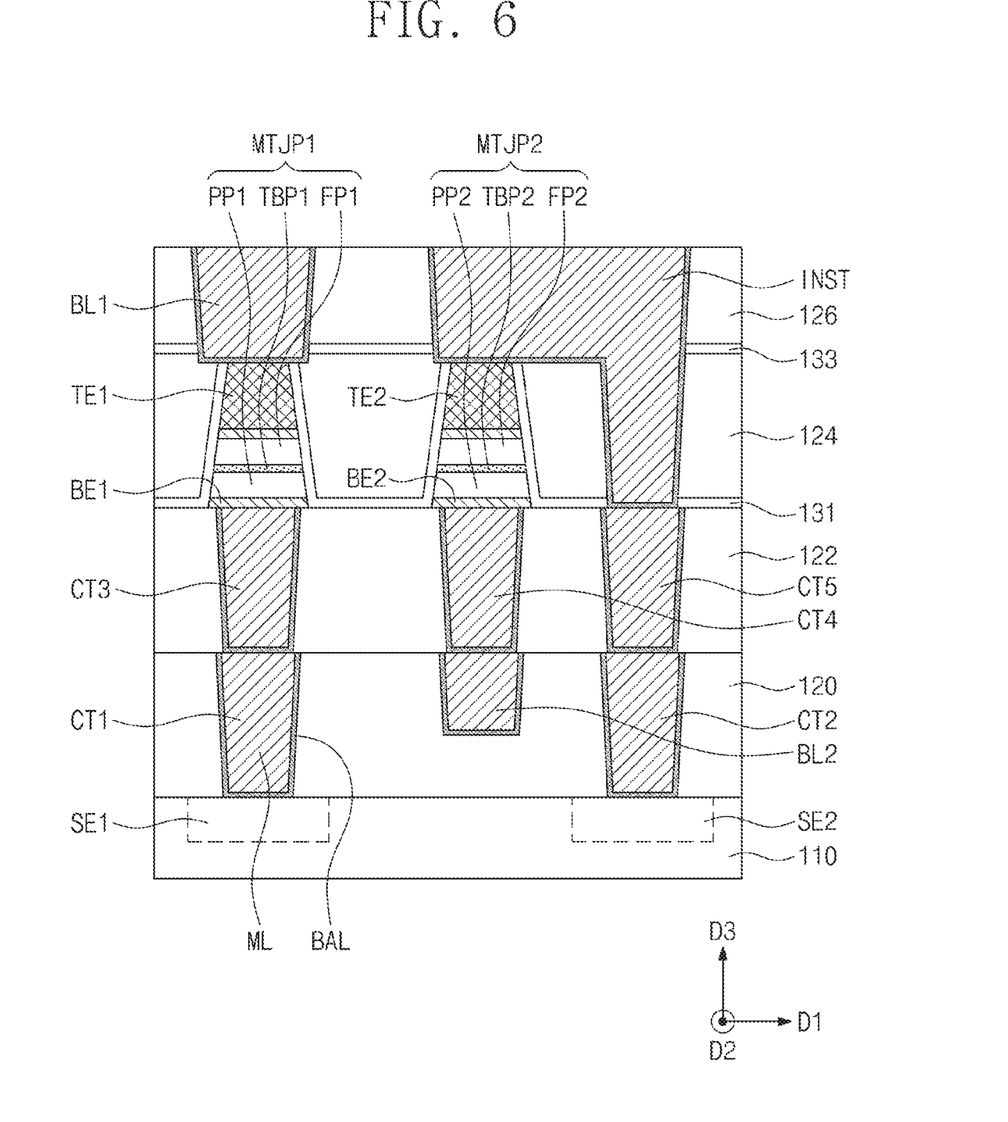
FIG. 6 is a circuit diagram illustrating a unit memory cell of a memory device according to an exemplary embodiment of the present inventive concept.

FIG. 6 is a circuit diagram illustrating a unit memory cell of a memory device according to an exemplary embodiment of the present inventive concept. For example, FIG. 6 is a cross-sectional view of the unit memory cell of FIGS. 4 and 5.

Referring to FIG. 6, a substrate 110 may be provided. The substrate 110 may include first and second select elements SE1 and SE2. The first and second select elements SE1 and SE2 may be controlled by a word line (not shown). In addition, a source line (not shown) may further be provided so that the source line is connected in common to a source region of the first select element SE1 and a source region of the second select element SE2.

A first interlayer dielectric layer 120 may be provided on the substrate 110. The first interlayer dielectric layer 120 may include, for example, silicon oxide, silicon nitride, or silicon oxynitride. The substrate 110 may be provided thereon with a second bit line BL2 and first and second contact plugs CT1 and CT2. The first contact plug CT1 may penetrate the first interlayer dielectric layer 120 and may be connected to a drain region of the first select element SE1 included in the substrate 110. The second contact plug CT2 may penetrate the first interlayer dielectric layer 120 and may be connected to a drain region of the second select element SE2 included in the substrate 110. The second bit line BL2 may be disposed in the first interlayer dielectric layer 120 and may extend along a second direction D2. Upper surfaces of the first and second contact plugs CT1 and CT2 may be positioned at substantially the same level as an upper surface of the second bit line BL2. In this description, the term "level" may mean a height measured from a top surface of the substrate 110. A lower surface of the second bit line BL2 may be higher than lower surfaces of the first and second contact plugs CT1 and CT2. Each of the second bit line BL2 and the first and second contact plugs CT1 and CT2 may be formed of a conductive material. For example, the second bit line BL2 and the first and second contact plugs CT1 and CT2 each may include a metal layer ML and a barrier layer BAL surrounding the metal layer. The barrier layer BAL may be conductive. For example, the barrier layer BAL may include TiN.

A third interlayer dielectric layer 122 may be provided on the first interlayer dielectric layer 120. The third interlayer dielectric layer 122 may include, for example, silicon oxide, silicon nitride, or silicon oxynitride. A third contact plug CT3, a fourth contact plug CT4, and a fifth contact plug CT5 may penetrate the third interlayer dielectric layer 122. The third contact plug CT3, the fourth contact plug CT4 and the fifth contact plug CT5 each may include a metal layer and a barrier layer surrounding the metal layer, like the first contact plug CT1, the second contact plug CT2 and the second bit line BL2. The third contact plug CT3 may be provided on the first contact plug CT1, the fourth contact plug CT4 may be provided on the second bit line BL2, and the fifth contact plug CT5 may be provided on the second contact plug CT2. The third contact plug CT3 may be electrically connected to the first contact plug CT1. The fourth contact plug CT4 may be electrically connected to the second bit line BL2. The fifth contact plug CT5 may be electrically connected to the second contact plug CT2.

The third contact plug CT3 may be provided thereon with a first bottom electrode BE1, a first magnetic tunnel junction pattern MTJP1, and a first top electrode TEE The fourth contact plug CT4 may be provided thereon with a second bottom electrode BE2, a second magnetic tunnel junction pattern MTJP2, and a second top electrode TE2. In this configuration, the first magnetic tunnel junction pattern MTJP1 may be electrically connected through the first bottom electrode BE1 to the first select element SE1, and the second magnetic tunnel junction pattern MTJP2 may be electrically connected through the second bottom electrode BE2 to the second bit line BL2.

The first magnetic tunnel junction pattern MTJP1 may include a first free pattern FP1, a first pinned pattern PP1, and a first tunnel barrier pattern TBP1 interposed therebetween. Likewise, the second magnetic tunnel junction pattern MTJP2 may include a second free pattern FP2, a second pinned pattern PP2, and a second tunnel barrier pattern TBP2 interposed therebetween. The first free pattern FP1, the first pinned pattern PP1, and the first tunnel barrier pattern TBP1 may be stacked in the same sequence as that in which the second free pattern FP2, the second pinned pattern PP2, and the second tunnel barrier pattern TBP2 are stacked.

As shown in FIG. 6, in the first and second magnetic tunnel junction patterns MTJP1 and MTJP2, the pinned patterns PP1 and PP2, the tunnel barrier patterns TBP1 and TBP2, and the free patterns FP1 and FP2 may be stacked on the substrate 110 in the listed order. The present inventive concept, however, is not limited thereto. For example, unlike FIG. 6, in the first and second magnetic tunnel junction patterns MTJP1 and MTJP2, the free patterns FP1 and FP2, the tunnel barrier patterns TBP1 and TBP2, and the pinned patterns PP1 and PP2 may be stacked on the substrate 110 in the listed order. Hereinafter, for brevity of the description, it will be assumed that the pinned patterns PP1 and PP2, the tunnel barrier patterns TBP1 and TBP2, and the free patterns FP1 and FP2 are stacked as shown in FIG. 6. The first and second magnetic tunnel junction patterns MTJP1 and MTJP2 will be described in detail with reference to FIGS. 10 and 11.

Like the top electrode TE of FIGS. 2 and 3, the first and second top electrodes TE1 and TE2 may include a metal nitride pattern and a metal pattern. Each of the first and second magnetic tunnel junction patterns MTJP1 and MTJP2 may include at its upper portion a non-magnetic capping layer of FIGS. 2 and 3. A relationship between thicknesses and widths of the metal nitride pattern, the metal pattern, and the magnetic tunnel junction patterns may be substantially the same as that discussed with reference to FIGS. 2 and 3.

A second interlayer dielectric layer 124 may be provided to include therein the bottom electrodes BE1 and BE2, the magnetic tunnel junction patterns MTJP1 and MTJP2, and the top electrodes TE1 and TE2. A protective layer 131 may be provided to cover sidewalls of the bottom electrodes BE1 and BE2, sidewalls of the magnetic tunnel junction patterns MTJP1 and MTJP2, and sidewalls of the top electrodes TE1 and TE2. For example, the protective layer 131 may include silicon nitride or aluminum oxide.

A fourth interlayer dielectric layer 126 may be provided on the second interlayer dielectric layer 124. An etch stop layer 133 may be provided between the second interlayer dielectric layer 124 and the fourth interlayer dielectric layer 126. For example, the etch stop layer 133 may include a silicon nitride layer. The fourth interlayer dielectric layer 126 may be provided therein with a first bit line BL1 and an interconnect structure INST. The first bit line BL1 may be electrically connected to the first top electrode TE1 and may extend along the second direction D2 like the second bit line BL2. The fifth contact plug CT5 may be electrically coupled to the interconnect structure INST penetrating the second and fourth interlayer dielectric layers 124 and 126. The interconnect structure INST may have an upper portion that extends onto a top surface of the second tunnel junction pattern MTJP2 and may be electrically coupled to the second tunnel junction pattern MTJP2.

Figure 7:
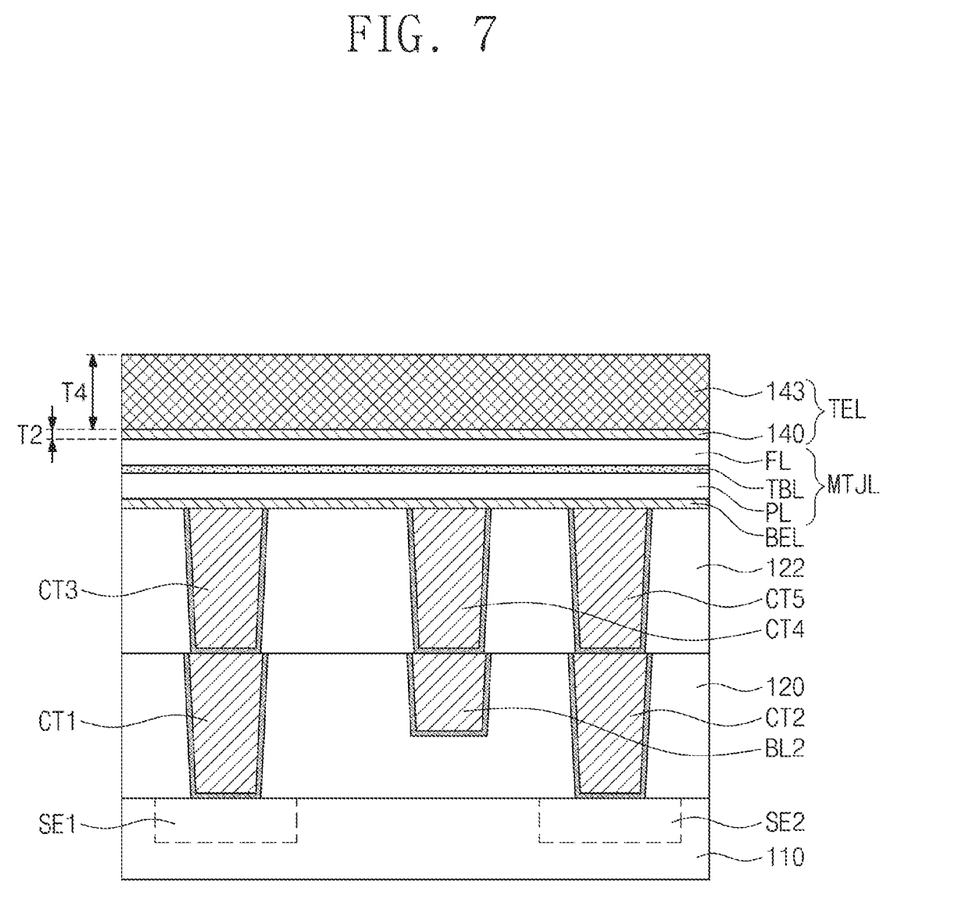
FIGS. 7 to 9 are cross-sectional views illustrating a method of fabricating a unit memory cell according to an exemplary embodiment of the present inventive concept.
Figure 8:
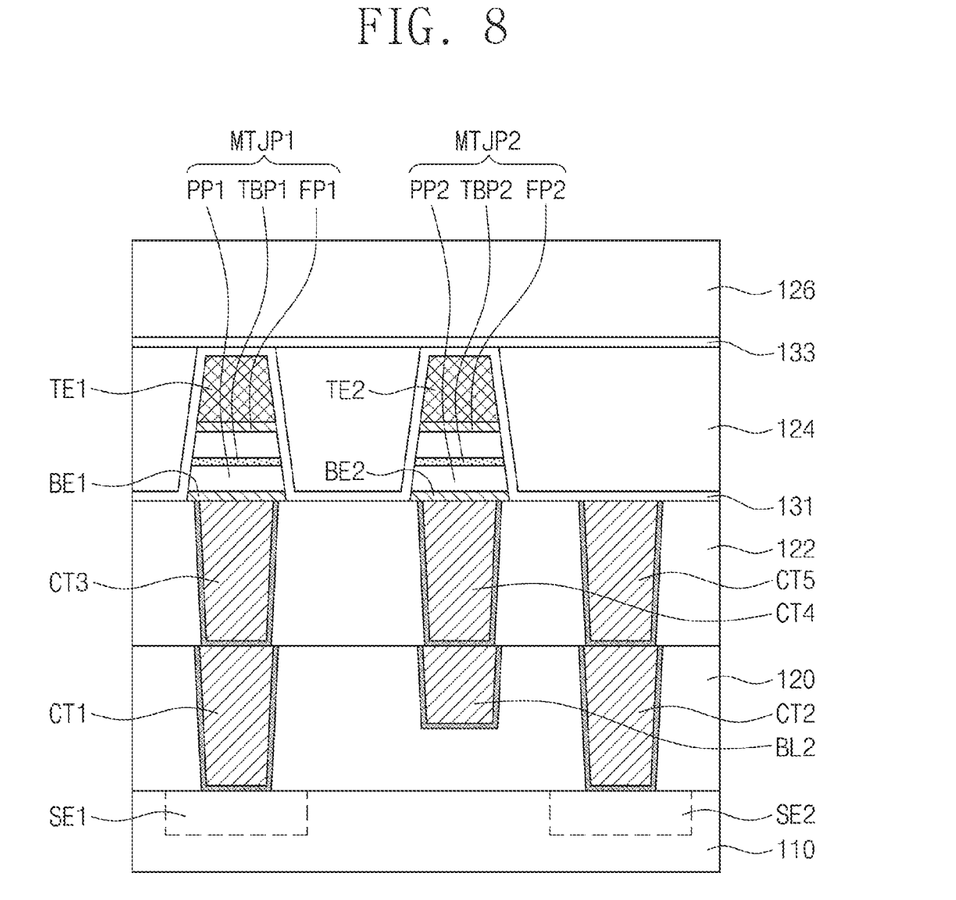
Figure 9:
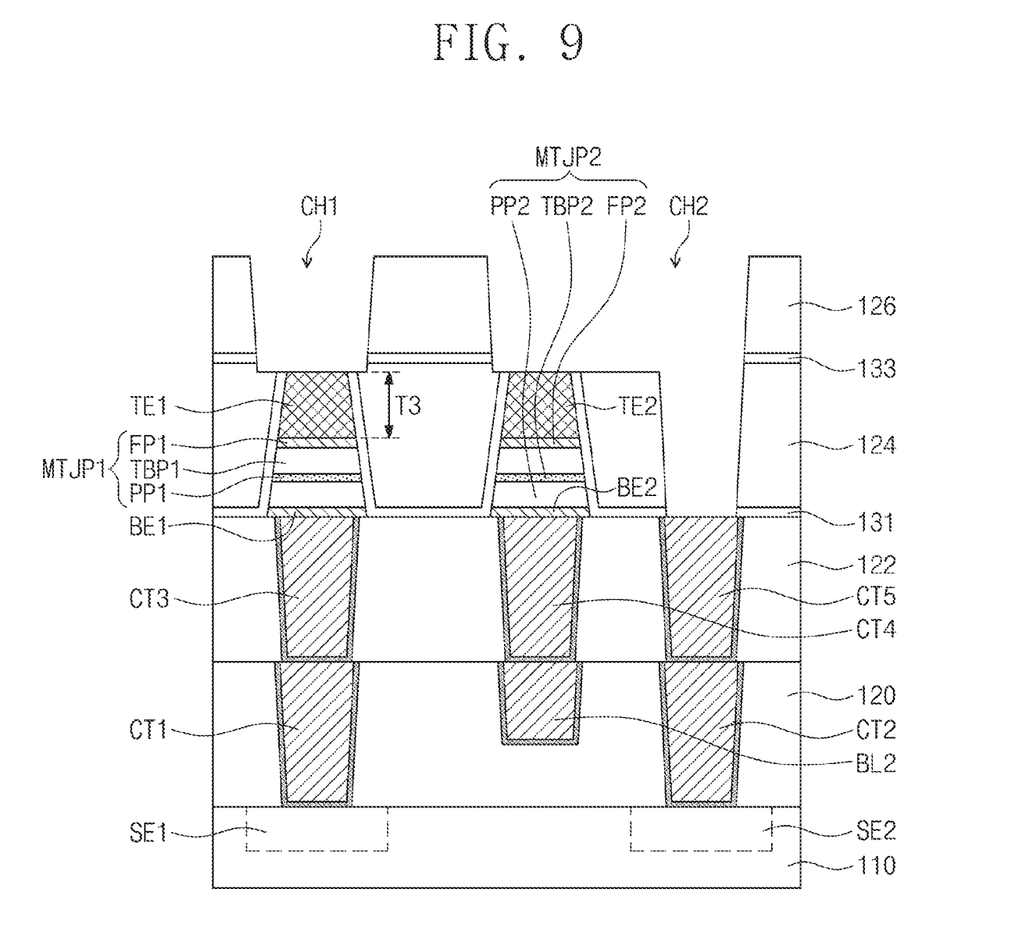

FIGS. 7 to 9 are cross-sectional views illustrating a method of fabricating a unit memory cell according to an exemplary embodiment of the present inventive concept. Like reference numerals of FIGS. 7 to 9 and FIGS. 2 and 3 may refer to the like elements, and a repetitive description thereof will be omitted in the interest of brevity of the description.

Referring to FIG. 7, a substrate 110 may be provided to include first and second select elements SE1 and SE2. A first interlayer dielectric layer 120 may be formed on the substrate 110. The first interlayer dielectric layer 120 may include, for example, silicon oxide, silicon nitride, or silicon oxynitride. The first interlayer dielectric layer 120 may be formed by, for example, a chemical vapor deposition (CVD) process or a physical vapor deposition (PVD) process.

First and second contact plugs CT1 and CT2 may be formed to penetrate the first interlayer dielectric layer 120. The first contact plug CT1 may be electrically connected to the first select element SE1, and the second contact plug CT2 may be electrically connected to the second select element SE2. In addition, a second bit line BL2 may be formed in the first interlayer dielectric layer 120. A third interlayer dielectric layer 122 may be formed on the first interlayer dielectric layer 120. Third, fourth, and fifth contact plugs CT3, CT4, and CT5 may be formed to penetrate the third interlayer dielectric layer 122. The third contact plug CT3 may be provided on the first contact plug CT1, the fourth contact plug CT4 may be provided on the second bit line BL2, and the fifth contact plug CT5 may be provided on the second contact plug CT2. The third contact plug CT3 may be electrically connected to the first contact plug CT1. The fourth contact plug CT4 may be electrically connected to the second bit line BL2. The fifth contact plug CT5 may be electrically connected to the second contact plug CT2.

A bottom electrode layer BEL, a magnetic tunnel junction layer MTJL, and a top electrode layer TEL may be sequentially formed on the third interlayer dielectric layer 122. Each of the layers BEL, MTJL, and TEL may be formed by, for example, a chemical vapor deposition (CVD) process or a physical vapor deposition (PVD) process. The top electrode layer TEL may include a metal nitride layer 140 and a metal layer 143. The magnetic tunnel junction layer MTJL may include a pinned layer PL, a tunnel barrier layer TBL, and a free layer FL that are sequentially stacked. The present inventive concept, however, is not limited thereto. The stacking sequence of the pinned layer PL and the free layer FL may be interchangeable. The magnetic tunnel junction layer MTJL will be described in detail with reference to FIGS. 10 and 11.

The metal nitride layer 140 may have a thickness T2 less than a thickness T4 of the metal layer 143. In an exemplary embodiment, the thickness T4 of the metal layer 143 may be about 9 times to about 11 times the thickness T2 of the metal nitride layer 140. For example, the thickness T4 of the metal layer 143 may be about 450 Å to about 550 Å, and the thickness T2 of the metal nitride layer 140 may be about 40 Å to about 60 Å.

Referring to FIG. 8, the top electrode layer TEL may be patterned to form first and second top electrodes TE1 and TE2, and then the first and second top electrodes TE1 and TE2 may serve as a mask to pattern their underlying magnetic tunnel junction layer MTJL and bottom electrode layer BEL. Using an ion beam etching process in which the first and second top electrodes TE1 and TE2 serve as masks, the bottom electrode layer BEL and the magnetic tunnel junction layer MTJL may be patterned to bottom electrodes BE1 and BE2 and magnetic tunnel junction patterns MTJP1 and MTJP2. Thereafter, a protective layer 131 may be formed to cover sidewalls of the bottom electrodes BE1 and BE2, sidewalls of the magnetic tunnel junction patterns MTJP1 and MTJP2, and sidewalls of the top electrodes TE1 and TE2. For example, the protective layer 131 may include silicon nitride or aluminum oxide. A preliminary second interlayer dielectric layer may be formed on the protective layer 131. After that, a planarization process may be performed on the preliminary second interlayer dielectric layer at least until a portion of the protective layer 131 may be exposed. The planarized preliminary second interlayer dielectric layer may be referred to as a second interlayer dielectric layer 124.

An etch stop layer 133 and a fourth interlayer dielectric layer 126 may be sequentially formed on the second interlayer dielectric layer 124 after the planarization process is performed.

Referring to FIG. 9, a first recess region CH1 may be formed to penetrate the fourth interlayer dielectric layer 126 and the etch stop layer 133, and a second recess region CH2 may be formed to penetrate the fourth interlayer dielectric layer 126, the second interlayer dielectric layer 124, the etch stop layer 133 and the protective layer 131. The formation of the first and second recess regions CH1 and CH2 may include a plurality of etching processes. For example, the formation of the second recess region CH2 may include a first etching process, which forms a contact hole penetrating the second and fourth interlayer dielectric layers 124 and 126, and a second etching process, which etches the fourth interlayer dielectric layer 126 using the etch stop layer 133 and exposes a top surface of the second top electrode TE2. The second etching process may form the first recess region CH1 together with the second recess region CH2.

Referring back to FIG. 6, a first bit line BL1 and an interconnect structure INST may be provided to respectively fill the first recess region CH1 and the second recess region CH2. The first bit line BL1 may extend along a second direction D2. The interconnect structure INST may electrically connect the fifth contact plug CT5 to the second magnetic tunnel junction pattern MTJP2.

Figure 10:
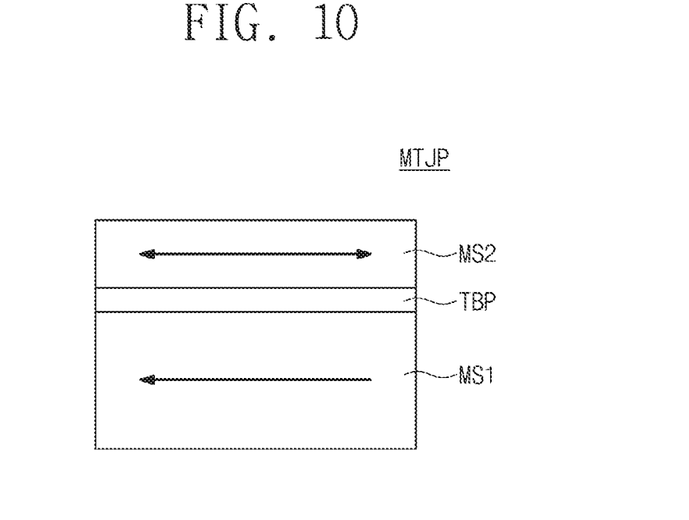
FIGS. 10 and 11 are conceptual diagrams for explaining a magnetic tunnel junction pattern according to an exemplary embodiment of the present inventive concept.
Figure 11:
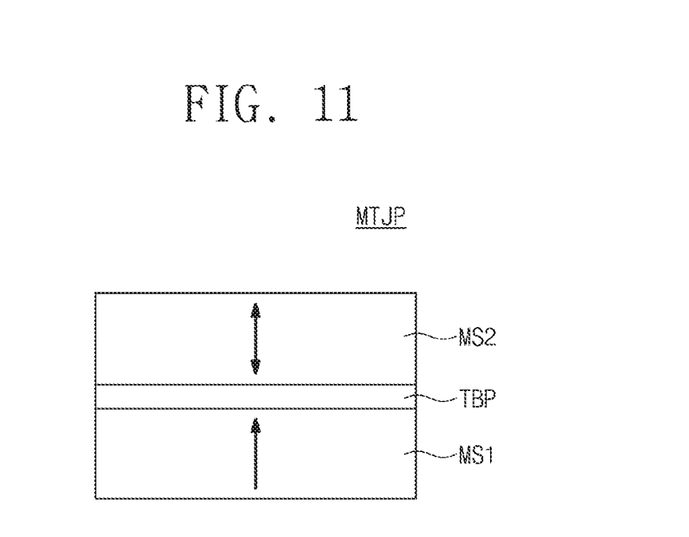

FIGS. 10 and 11 are conceptual diagrams for explaining a magnetic tunnel junction pattern according to an exemplary embodiment of the present inventive concept. A magnetic tunnel junction pattern MTJP may include a first magnetic pattern MS1, a tunnel barrier pattern TBP, and a second magnetic pattern MS2. One of the first and second magnetic patterns MS1 and MS2 may be a free pattern of a magnetic tunnel junction (MTJ), and the other of the first and second magnetic patterns MS1 and MS2 may be a pinned pattern of the magnetic tunnel junction. For brevity of the description, it will be described hereinafter the case that the first magnetic pattern MS1 is a pinned pattern and the second magnetic pattern MS2 is a free pattern. In an exemplary embodiment, the first magnetic pattern MS1 may be a free pattern and the second magnetic pattern MS2 may be a pinned pattern. An electrical resistance of the magnetic tunnel junction pattern MTJP may be determined according to a relative orientation of magnetization directions of the free and pinned patterns. For example, if the magnetization directions of the free and pinned patterns are antiparallel, the magnetic tunnel junction pattern MTJP may have a first resistance; and if the magnetization directions of the free and pinned patterns are parallel, the magnetic tunnel junction pattern MTJP may have a second resistance smaller than the first resistance. Consequently, the electrical resistance of the magnetic tunnel junction pattern MTJP may be switchable by changing the magnetization direction of the free pattern, which may be used as a data storage principle of magnetic memory devices according to an exemplary embodiment of the present inventive concept.

Referring to FIG. 10, the first and second magnetic patterns MS1 and MS2 may be magnetic layers for forming a structure with in-plane magnetization substantially parallel to a top surface of the tunnel barrier pattern TBP. The first magnetic pattern MS1 may include a layer having an anti-ferromagnetic material and a layer having a ferromagnetic material. The anti-ferromagnetic material may include PtMn, IrMn, MnO, MnS, MnTe, $MnF_2$, $FeCl_2$, FeO, $CoCl_2$, CoO, $NiCl_2$, NiO, or Cr. The anti-ferromagnetic material may include at least one precious metal such as ruthenium (Ru), rhodium (Rh), palladium (Pd), osmium (Os), iridium (Ir), platinum (Pt), gold (Au), and silver (Ag). The ferromagnetic material may include CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MS2 may include a material having a changeable magnetization direction. The second magnetic pattern MS2 may include a ferromagnetic material. For example, the ferromagnetic material may include CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The second magnetic pattern MS2 may be composed of a plurality of layers. For example, the second magnetic pattern MS2 may include layers having a plurality of ferromagnetic materials and a layer having a non-magnetic material between the layers. In this case, the layers having a plurality of ferromagnetic materials and the layer having a non-magnetic material may constitute a synthetic anti-ferromagnetic layer. The synthetic anti-ferromagnetic layer may reduce critical current density and increase thermal stability of magnetic memory devices.

The tunnel barrier pattern TBP may include oxide of magnesium (Mg), oxide of titanium (Ti), oxide of aluminum (Al), oxide of magnesium-zinc (MgZn), oxide of magnesium-boron (MgB), nitride of titanium (Ti), or nitride of vanadium (V). For example, the tunnel barrier pattern TBP may be a single or monolayer of magnesium oxide (MgO). The present inventive concept is not limited thereto. For example, the tunnel barrier pattern TBP may include a plurality of layers. A chemical vapor deposition (CVD) process may be used to form the tunnel barrier pattern TBP.

Referring to FIG. 11, the first and second magnetic patterns MS1 and MS2 may have a perpendicular magnetization structure whose magnetization direction is substantially perpendicular to a top surface of the tunnel barrier pattern TBP. The first and second magnetic patterns MS1 and MS2 may include a material having an $L1_0$ crystal structure, a material having a hexagonal close-packed lattice, or an amorphous RE-TM (Rare Earth Transition Metal) alloy. For example, the first and second magnetic patterns MS1 and MS2 may include an $L1_0$ crystal structure such as $Fe_{50}Pt_{50}$, $Fe_{50}Pd_{50}$, $Co_{50}R_{50}$, $Co_{50}Pd_{50}$, and $Fe_{50}Ni_{50}$. The present inventive concept is not limited thereto. For example, the first and second magnetic patterns MS1 and MS2 may include a $Co_3Pt$ ordered alloy or a cobalt-platinum (CoPt) disordered alloy, in which platinum (Pt) is contained to have a content ranging from 10 at % to 45 at % having a hexagonal close-packed lattice. For example, the first and second magnetic patterns MS1 and MS2 may include at least one amorphous RE-TM alloy, which contains at least one of iron (Fe), cobalt (Co), and nickel (Ni) and at least one rare-earth metal such as terbium (Tb), dysprosium (Dy), and gadolinium (Gd).

The first and second magnetic patterns MS1 and MS2 may include a material exhibiting interface perpendicular magnetic anisotropy. The interface perpendicular magnetic anisotropy may refer to a perpendicular magnetization phenomenon, which may be seen at an interface of a magnetic layer having an intrinsic in-plane magnetization property if the magnetic layer is in contact with its adjacent layer. Herein, the term "intrinsic in-plane magnetic property" may mean that a magnetization direction of a magnetic layer is oriented parallel to a widest surface (or a longitudinal direction) of the magnetic layer if no external factor is applied thereto. For example, when a substrate is provided thereon with a magnetic layer having the intrinsic in-plane magnetization property and no external factor is applied to the magnetic layer, a magnetization direction of the magnetic layer may be oriented substantially parallel to a top surface of the substrate.

For example, the first and second magnetic patterns MS1 and MS2 may include cobalt (Co), iron (Fe), or nickel (Ni). The first and second magnetic patterns MS1 and MS2 may further include at least one non-magnetic material including boron (B), zinc (Zn), aluminum (Al), titanium (Ti), ruthenium (Ru), tantalum (Ta), silicon (Si), silver (Ag), gold (Au), copper (Cu), carbon (C), nitrogen (N), or any combination thereof. For example, the first and second magnetic patterns MS1 and MS2 may include CoFe or NiFe and may further include boron (B). Additionally, to reduce saturation magnetization, the first and second magnetic patterns MS1 and MS2 may further include titanium (Ti), aluminum (Al), silicon (Si), magnesium (Mg), tantalum (Ta), or silicon (Si). The first and second magnetization patterns MS1 and MS2 may be formed using a sputtering process or a chemical mechanical deposition (CVD) process.

According to an exemplary embodiment of the present inventive concept, a magnetic memory device may be provided with increased reliability caused by an increase of adhesion force between a top electrode and its underlying magnetic tunnel junction pattern by using the metal nitride pattern 141.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A magnetic memory device, comprises:
   a first magnetic tunnel junction pattern and a second magnetic tunnel junction pattern that are horizontally spaced apart from each other on a substrate;
   a first bit line disposed on the first magnetic tunnel junction pattern;
   a first select element disposed in the substrate,
   wherein the first bit line is electrically connected to the first select element through the first magnetic tunnel junction pattern;
   a second bit line disposed below the second magnetic tunnel junction pattern;
   a second select element disposed in the substrate,
   wherein the second bit line is electrically connected to the second select element through the second magnetic tunnel junction pattern; and
   a first top electrode and a second top electrode respectively disposed on the first magnetic tunnel junction pattern and the second magnetic tunnel junction pattern,
   wherein each of the first top electrode and the second top electrode comprises a metal nitride pattern and a metal pattern disposed on the metal nitride pattern, the metal nitride pattern being thinner than the metal pattern,
   wherein each of the first magnetic tunnel junction pattern and the second magnetic tunnel junction pattern comprises a non-magnetic metallic capping layer that directly contacts the metal nitride pattern,
   wherein the non-magnetic metallic capping layer has a single sublayer, and
   wherein each of the first top electrode and the second top electrode has an increasing width toward the non-magnetic metallic capping layer.

2. The magnetic memory device of claim 1,
   wherein the metal pattern has a thickness of more than about 5 times and less than about 7 times a thickness of the metal nitride pattern.

3. The magnetic memory device of claim 1,
   wherein the metal pattern has a thickness less than a thickness of each of the first and second magnetic tunnel junction patterns.

4. The magnetic memory device of claim 1,
   wherein each of the first magnetic tunnel junction pattern and the second magnetic tunnel junction pattern has a thickness of about 0.5 times to about 1.5 times a thickness of the metal pattern.

5. The magnetic memory device of claim 1,
wherein the metal nitride pattern comprises a metal element different from that of the metal pattern,
wherein the metal pattern comprises tungsten, and
wherein the metal nitride pattern comprises titanium nitride.

6. The magnetic memory device of claim 1,
wherein the non-magnetic metallic capping layer is a topmost layer of each of the first magnetic tunnel junction pattern and the second magnetic tunnel junction pattern.

7. The magnetic memory device of claim 1,
wherein the non-magnetic metallic capping layer includes an amorphous portion.

8. The magnetic memory device of claim 1, further comprising:
an interconnect structure that is in contact with a top surface of the second top electrode and electrically connects the second select element to the second magnetic tunnel junction pattern,
the second select element is positioned at a level lower than a level of the second magnetic tunnel junction pattern.

\* \* \* \* \*